(12) United States Patent
Padmanabhan et al.

(10) Patent No.: US 7,075,133 B1
(45) Date of Patent: Jul. 11, 2006

(54) SEMICONDUCTOR DIE WITH HEAT AND ELECTRICAL PIPES

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 17 days.

(21) Appl. No.: 10/838,499

(22) Filed: May 3, 2004

(51) Int. Cl.
*H01L 31/112* (2006.01)

(52) U.S. Cl. .................. 257/276; 257/69; 257/350; 438/122

(58) Field of Classification Search ............... None
See application file for complete search history.

(56) References Cited

U.S. PATENT DOCUMENTS

| 6,249,136 B1 * | 6/2001 | Maley ............... 324/765 |
| 6,677,235 B1 | 1/2004 | Yegnashankaran et al. . 438/667 |
| 2004/0152240 A1 * | 8/2004 | Dangelo ............. 438/122 |

* cited by examiner

*Primary Examiner*—David Nelms
*Assistant Examiner*—Long Tran
(74) *Attorney, Agent, or Firm*—Mark C. Pickering

(57) ABSTRACT

Thermal hot spots in the substrate of a semiconductor die, and the required surface area of the semiconductor die, are substantially reduced by forming thermal or thermal and electrical pipes in the substrate that extend from a bottom surface of the substrate to a point near the top surface of the substrate.

14 Claims, 5 Drawing Sheets

SEMICONDUCTOR DIE WITH HEAT AND ELECTRICAL PIPES

BACKGROUND OF THE INVENTION

1. Field of the Invention

The present invention relates to semiconductor dice and, more particularly, to a semiconductor die with heat and electrical pipes.

2. Description of the Related Art

Conventional semiconductor die have many advantages, but also suffer from a number of problem areas. One problem area is the removal of heat from the substrate of the die. The high current circuits of current-generation integrated circuits can generate significant amounts of heat in the substrate which, if not removed, can damage or erroneously bias adjacent circuits.

Another problem area is the surface area penalty that is paid to provide electrical contacts to the different regions of the substrate. For example, current-generation semiconductor die commonly have a large number of wells to support a large number of electrically-isolated CMOS circuits.

To place voltages on the wells, each well must be electrically contacted, and can be electrically contacted multiple times. Each electrical contact, in turn, consumes a region on the surface of the substrate (where the minimum size of the region is defined by the design rules of the fabrication process). Thus, a large number of well contacts consume a large amount of the surface area of the die.

FIG. 1 shows a cross-sectional diagram that illustrates a prior-art semiconductor die 100. As shown in FIG. 1, semiconductor die 100 includes a conventional semiconductor substrate 110 that has a top surface 110A, a bottom surface 110B, and a thickness T1 of approximately $500-750\times10^{-6}$ m (500–750 microns or approximately 20–30 mils).

Further, die 100 includes a p– region 112 and a number of shallow trench isolation (STI) regions that are located in substrate 110. In addition, die 100 includes a p– well 114 and an n– well 116 that are located in substrate 110 to contact p– region 112. P– well 114 has a heavier dopant concentration than p– region 112 of substrate 110.

As further shown in FIG. 1, semiconductor die 100 includes a p+ substrate contact region 120 that is located in substrate 110 to contact p– region 112, a p+ well contact 122 that is located in substrate 110 to contact p– well 114, and an n+ well contact 124 that is located in substrate 110 to contact n– well 116.

Semiconductor die 100 additionally includes an NMOS transistor 126 and a PMOS transistor 128. NMOS transistor 126 has spaced-apart n+ source and drain regions 130 and 132 that are located in p– well 114, and a channel region 134 of p– well 114 that is located between source and drain regions 130 and 132. NMOS transistor 126 also has a gate oxide layer 136 that is formed on p– well 114 over channel region 134, and a gate 138 that is formed on gate oxide layer 136 over channel region 134.

PMOS transistor 128 has spaced-apart p+ source and drain regions 140 and 142 that are located in n– well 116, and a channel region 144 of n– well 116 that is located between source and drain regions 140 and 142. PMOS transistor 128 also has a gate oxide layer 146 that is formed on n– well 116 over channel region 144, and a gate 148 that is formed on gate oxide layer 146 over channel region 144.

As additionally shown in FIG. 1, die 100 includes a first dielectric layer 150 that is formed on top surface 110A of substrate 110 over p+ regions 120, 122, 140, and 142, n+ regions 124, 130, and 132, and gates 138 and 148. Die 100 further includes a large number of contacts 152 that are formed through first dielectric layer 150 to make electrical connections with p+ regions 120, 122, 140, and 142, n+ regions 124, 130, and 132, and gates 138 and 148.

Semiconductor die 100 also includes a large number of metal-1 regions 156, such as traces and lines, that are formed on first dielectric layer 150 to make electrical connections with the contacts 152, and a second dielectric layer 160 that is formed on first dielectric layer 150 and the metal-1 regions 156.

Die 100 further includes a large number of vias 162 that are formed through second dielectric layer 160 to make electrical connections with the metal-1 regions 156, a large number of metal-2 regions 164, such as traces and lines, that are formed on second dielectric layer 160 to make electrical connections with the vias 162, and a top dielectric layer 170 that is formed on second dielectric layer 160 and the metal-2 regions 164.

In operation, significant amounts of heat can be generated in the channel regions 134 and 144 when transistors 126 and 128 are high current transistors, such as driver transistors. Further, as shown in FIG. 1, p+ regions 120 and 122 and n+region 124, along with the adjacent STI regions, consume a significant amount of the area of top surface 110A providing electrical connections to p– region 112 of substrate 110, p– well 114, and n– well 116, respectively.

As a result, there is a need for a semiconductor die that reduces the build up of heat in the high-current regions of the die. In addition, there is a need for a semiconductor die that reduces the amount of surface area that is consumed by the substrate and well contacts.

DETAILED DESCRIPTION OF THE INVENTION

Figure 1:
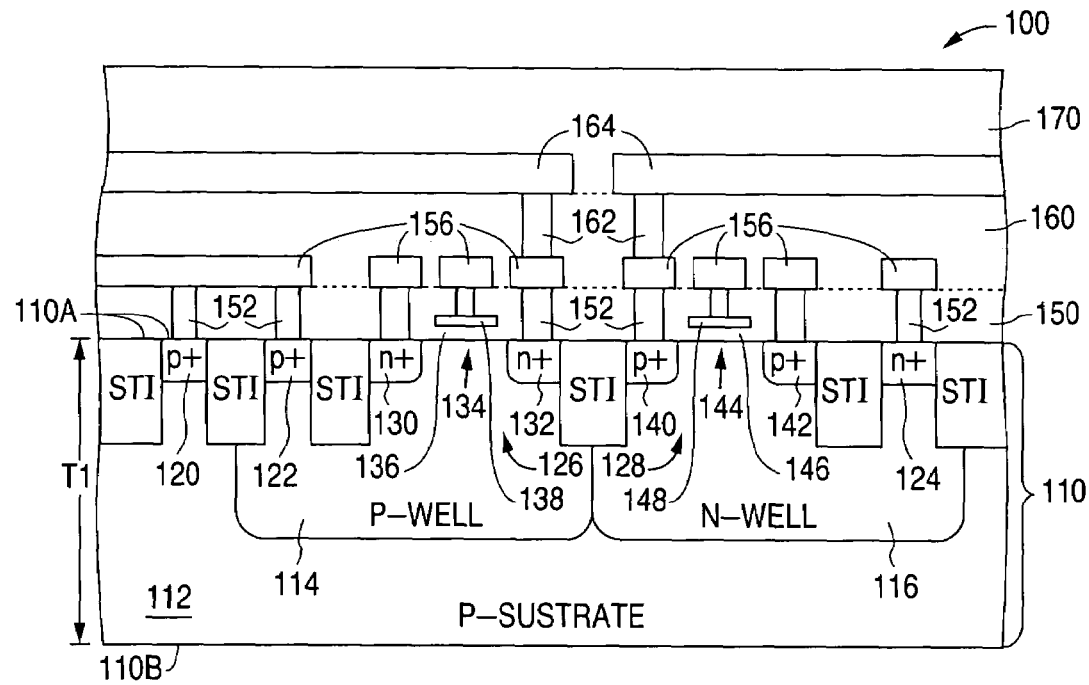
FIG. 1 is a cross-sectional diagram illustrating a prior-art semiconductor die 100.
Figure 2:
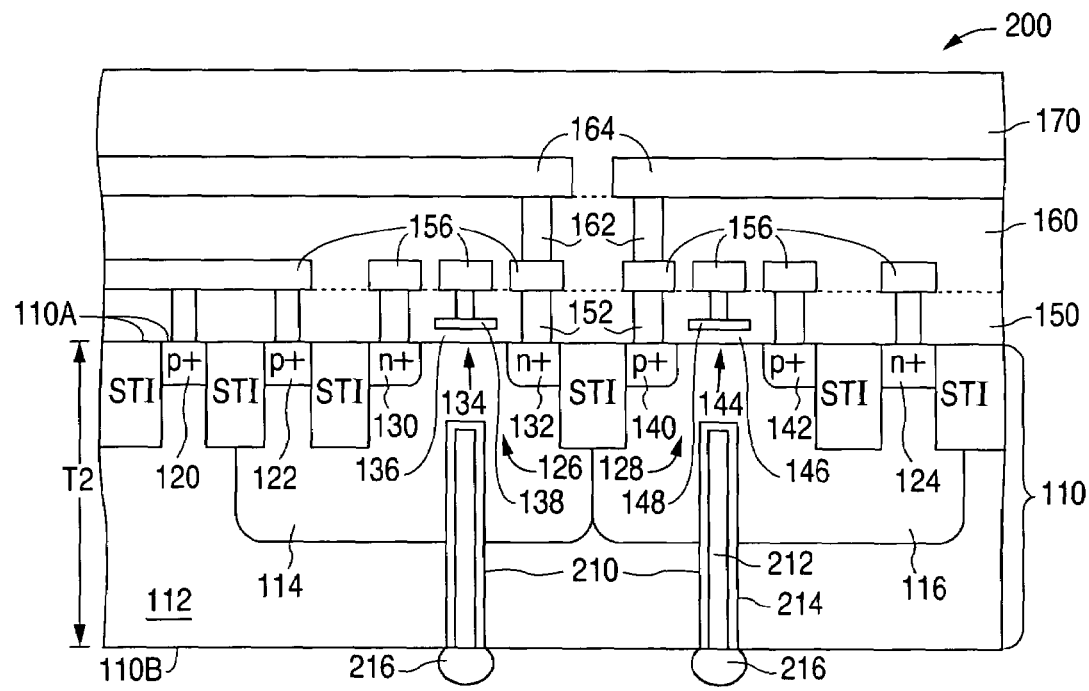
FIG. 2 is a cross-sectional diagram illustrating a semiconductor die 200 in accordance with the present invention.

FIG. 2 shows a cross-sectional view that illustrates a semiconductor die 200 in accordance with the present invention. Semiconductor die 200 is similar to semiconductor die 100 and, as a result, utilizes the same reference numerals to designate the structures which are common to both die.

As shown in FIG. 2, semiconductor die 200 differs from semiconductor die 100 in that semiconductor die 200 includes a number of thermally-conductive heat pipes 210 that are located in substrate 110 to extend from bottom surface 110B of substrate 110 up to near top surface 110A of substrate 110, where near is defined to be within $5\times10^{-6}$ m (five microns) of top surface 110A of substrate 110, without touching top surface 110A of substrate 110.

Heat pipes 210 can include a metal region 212, such as metal silicide or other metallic materials and combinations, and an electrically isolating material 214, such as oxide, that completely surrounds metal region 212 in substrate 110. As a result, heat pipes 210 can thermally transfer heat faster than substrate 110 transfers heat.

In addition, as further shown in FIG. 2, semiconductor die 200 can also include a thermally-conductive interconnect 216, such as a solder ball, that allows a thermally-conductive path to be formed between die 200 and a carrier substrate or a printed circuit board when the bottom surface of die 200 is electrically connected to the carrier substrate or printed circuit board using through-the-wafer metal plugs. Further, die 200 is significantly thinner than die 100, having an etchable thickness T2, which is defined to be approximately 12–100×10$^{-6}$ m (12–100 microns or approximately 0.5–4 mils).

One of the advantages of the present invention is that the thermal hot spots in substrate 110 can be easily accessed from the backside of die 200. Unlike top surface 110A of substrate 110, which is dotted with p+ and n+ active regions and gate structures that significantly limit access to the thermal hot spots in substrate 110, the bottom surface of substrate 110 is free from any region or structure which would impede access to a hot spot.

As a result, heat pipes can be easily added to any substrate region which is excessively hot. Further, multiple heat pipes can be clustered together to increase the heat flow from the area. For example, three heat pipes 210 could be formed near channel region 134, while only one heat pipe 210 is formed near channel region 144 when channel region 134 is substantially hotter than channel region 144.

Figure 3:
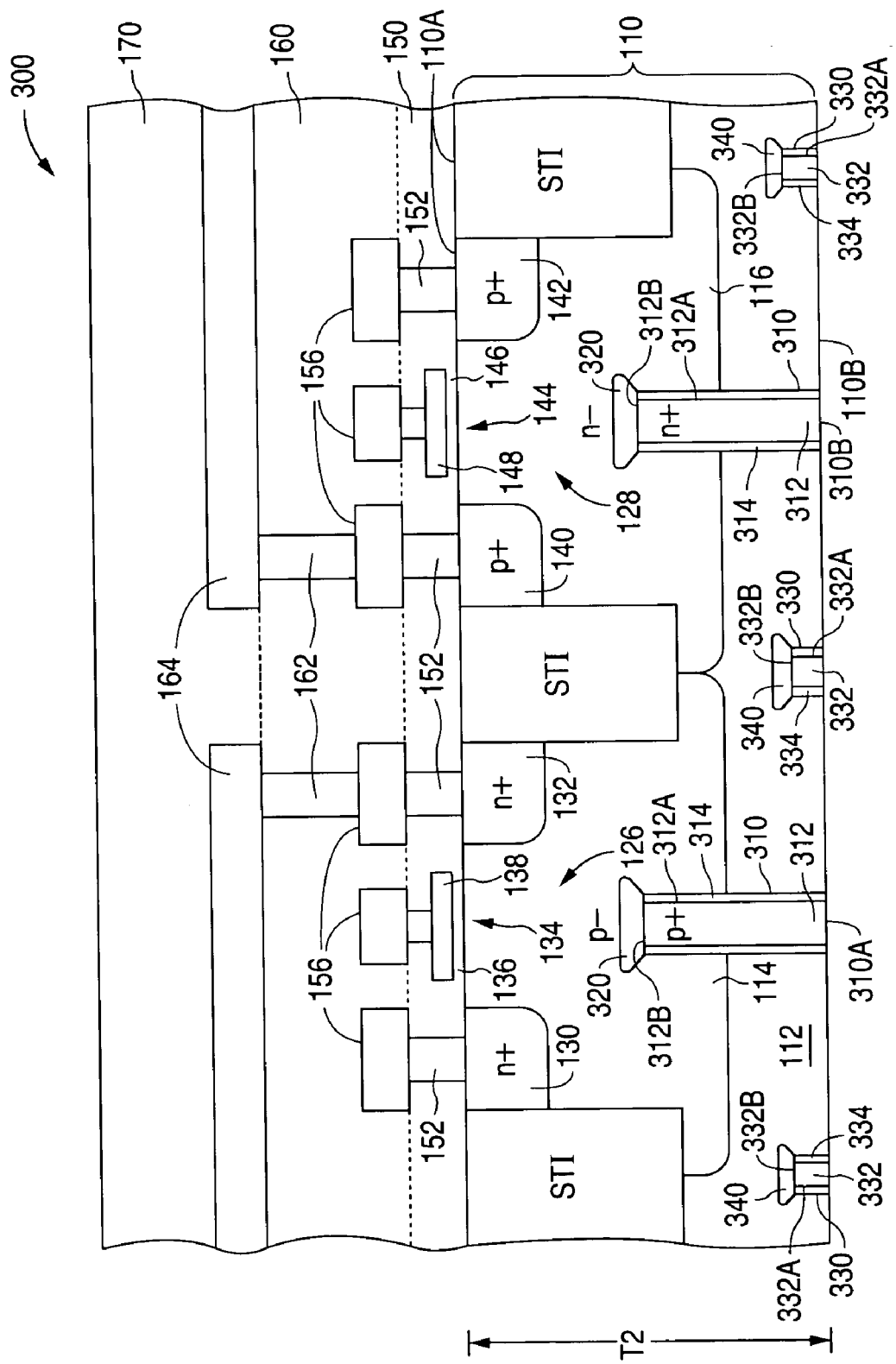
FIG. 3 is a cross-sectional diagram illustrating a semiconductor die 300 in accordance with the present invention.

FIG. 3 shows a cross-sectional view that illustrates a semiconductor die 300 in accordance with the present invention. Semiconductor die 300 is similar to semiconductor die 200 and, as a result, utilizes the same reference numerals to designate the structures which are common to both die.

As shown in FIG. 3, semiconductor die 300 differs from semiconductor die 200 in that semiconductor die 300 includes heat/electrical pipes 310 in lieu of heat pipes 210. As further shown in FIG. 3, each heat/electrical pipe 310 can include a metal region 312, such as metal silicide or other metallic materials and combinations, and an electrically isolating material 314, such as oxide, that only partially surrounds metal region 312.

Metal region 312, which can have a pillar shape, has a side wall 312A and an end or top wall 312B. Isolating material 314, in turn, contacts side wall 312A, isolating side wall 312A from substrate 110. Isolating material 314, however, does not contact top wall 312B. As a result, top wall 312B contacts substrate 110.

In addition, semiconductor die 300 can include a number of contact regions 320 that corresponds with the heat/electrical pipes 310. Each contact region 320 lies between and contacts the top wall 312B and substrate 110 of a heat/electrical pipe 310. Each contact region 320 has the same conductivity type, but a greater dopant concentration, than the adjoining region of substrate 110.

In operation, since the top walls 312B of the heat/electrical pipes 310 contact substrate 110 either directly or via contact regions 320, the heat/electrical pipes 310 can be used to both set the voltages on the wells and provide a thermally conductive path. As shown in FIG. 3, heat/electrical pipe 310A can be used to both set the voltage on p– well 114 and provide a thermally conductive path, while heat/electrical pipe 310B can be used to both set the voltage on n– well 116 and provide a thermally conductive path.

As a result, one of the advantages of the present invention is that, in addition to providing a thermal path to substantially reduce thermal hot spots in substrate 110, the present invention also eliminates the need for p+ well contact 122, n+ well contact 124, and the adjoining STI regions required by semiconductor die 100.

As further shown in FIG. 3, semiconductor die 300 also differs from semiconductor die 200 in that semiconductor die 300 includes heat/electrical pipes 330 that are located in p– region 112 of substrate 110.

Heat/electrical pipes 330 are identical to heat/electrical pipes 310 except that heat/electrical pipes 330 are shorter to set the voltage on p– region 112 of substrate 110.

Thus as above, each heat/electrical-pipe 330 can include a metal region 332, such as metal silicide or other metallic materials and combinations, and an electrically isolating material 334, such as oxide, that only partially surrounds metal region 332. Metal region 332, which can have a pillar shape, has a side wall 332A and an end or top wall 332B. Isolating material 334, in turn, contacts side wall 332A, isolating side wall 332A from substrate 110. Isolating material 334, however, does not contact top wall 332B. As a result, top wall 332B contacts p– region 112 of substrate 110.

In addition, semiconductor die 300 can include a number of contact regions 340 that corresponds with the heat/electrical pipes 330. Each contact region 340 lies between and contacts the top wall 332B and substrate 110 of a heat/electrical pipe 330. Each contact region 340 has the same conductivity type, but a greater dopant concentration than, the adjoining region of substrate 110.

As a result, one of the advantages of the present invention is that, in addition to providing a thermal path to substantially reduce thermal hot spots in substrate 110, the present invention also eliminates the need for p+ substrate contact 120 and the adjoining STI region required by semiconductor die 100. Thus, since the present invention eliminates the need for p+ substrate contact 120, p+ well contact 122, n+ well contact 124, and the adjoining STI regions, the present invention reduces the amount of area of top surface 110A that is consumed by the substrate and well contacts.

Figure 4A:
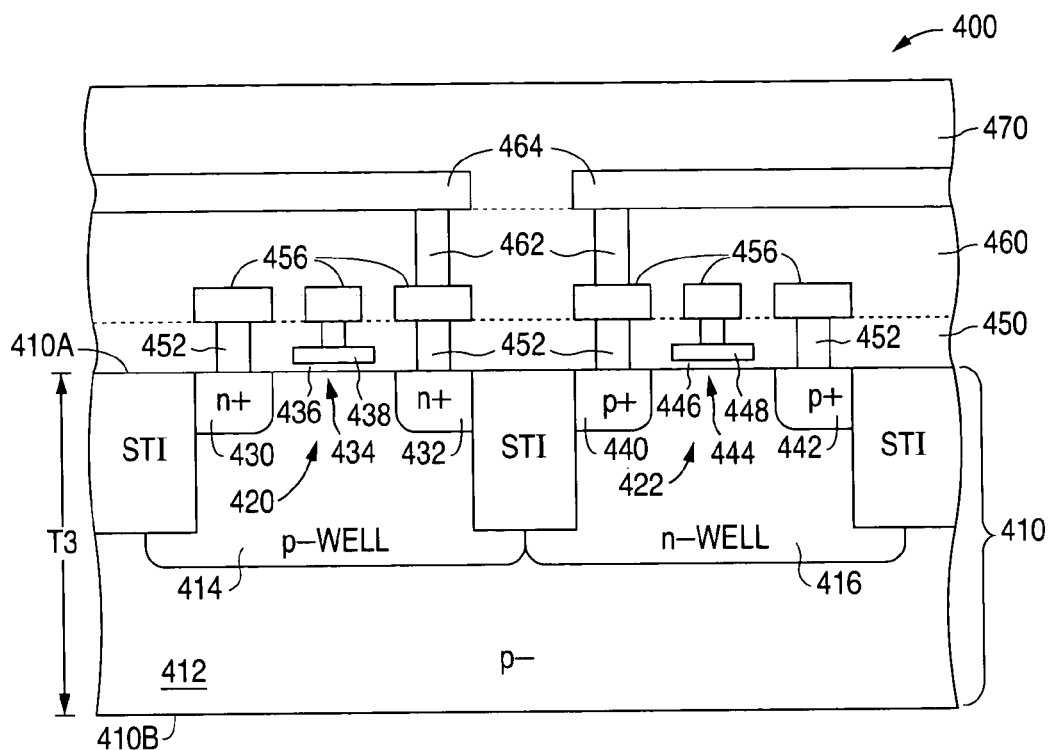
FIGS. 4A–4F are a series of cross-sectional views illustrating a method of forming a die in accordance with the present invention.

FIGS. 4A–4F show a series of cross-sectional views that illustrate a method of forming a die in accordance with the present invention. As shown in FIG. 4A, the method begins with a semiconductor die 400 that has been conventionally formed, except that the substrate and well contacts have been eliminated.

Semiconductor die 400 includes a semiconductor substrate 410 that has a top surface 410A, a bottom surface 410B, and a thickness T3 of approximately 500–750×10$^{-6}$ m (500–750 microns or approximately 20–30 mils). Further, die 400 includes a p– region 412 and a number of shallow trench isolation (STI) regions that are located in substrate 410. In addition, die 400 includes a p– well 414 and an n– well 416 that are located in substrate 410 to contact p– region 412. P–well 414 has a heavier dopant concentration than p– region 412 of substrate 410.

As further shown in FIG. 4A, semiconductor die 400 includes an NMOS transistor 420 and a PMOS transistor 422. NMOS transistor 420 has spaced-apart n+ source and drain regions 430 and 432 that are formed in p– well 414, and a channel region 434 of p– well 414 that is located between source and drain regions 430 and 432. NMOS transistor 420 also has a gate oxide layer 436 that is formed on p– well 414 over channel region 434, and a gate 438 that is formed on gate oxide layer 436 over channel region 434.

PMOS transistor 422 has spaced-apart p+ source and drain regions 440 and 442 that are formed in n– well 416, and a channel region 444 of n– well 416 that is located between source and drain regions 440 and 442. PMOS transistor 422 also has a gate oxide layer 446 that is formed on n– well 414 over channel region 444, and a gate 448 that is formed on gate oxide layer 446 over channel region 444.

As additionally shown in FIG. 4A, die 400 includes a first dielectric layer 450 that is formed on top surface 410A of substrate 410 over n+ regions 430 and 432, p+ regions 440 and 442, and gates 438 and 448. Die 400 further includes a large number of contacts 452 that are formed through first dielectric layer 450 to make electrical connections with n+ regions 430 and 432, p+ regions 440 and 442, and gates 438 and 448.

Semiconductor die 400 also includes a large number of metal-1 regions 456, such as traces and lines, that are formed on first dielectric layer 450 to make electrical connections with the contacts 452, and a second dielectric layer 460 that is formed on first dielectric layer 450 and the metal-1 regions 456.

Die 400 further includes a large number of vias 462 that are formed through second dielectric layer 460 to make electrical connections with the metal-1 regions 456, a large number of metal-2 regions 464, such as traces and lines, that are formed on second dielectric layer 460 to make electrical connections with the vias 462, and a top dielectric layer 470 that is formed on second dielectric layer 460 and the metal-2 regions 464.

Figure 4B:
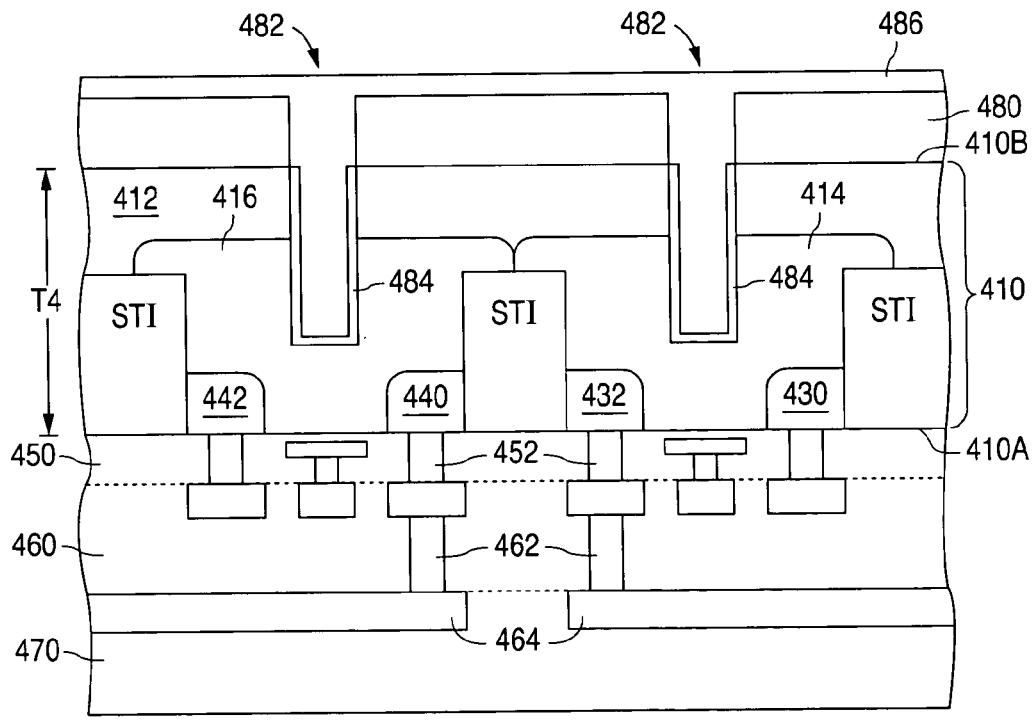

As shown in FIG. 4B, the method begins by back grinding bottom surface 410B of semiconductor die 400 until substrate 410 has an etchable thickness T4 that lies in the range of approximately $12$–$100 \times 10^{-6}$ m ($12$–$100$ microns or approximately $0.5$–$4$ mils). An etchable thickness of silicon is a thickness that can be anisotropically etched through in a relatively short period of time.

For example, an etchable thickness of silicon of $25 \times 10^{-6}$ m ($25$ microns or $1$ mil) can be anisotropically etched through in a reactive ion etcher in a relatively short period of time, e.g., $30$ minutes. By contrast, approximately eight hours are required to etch through silicon that is $500 \times 10^{-6}$ m ($500$ microns or $20$ mils) thick.

Following this, a mask 480, such as a hard mask, is formed and patterned on bottom surface 410A of substrate 410. Once mask 480 has been formed and patterned, the exposed regions of substrate 410 are etched until a number of openings 482 are formed in substrate 410. After the openings 482 have been formed, the exposed regions of substrate 410 are oxidized to form insulation layers 484 that line the openings 482.

Figure 4C:
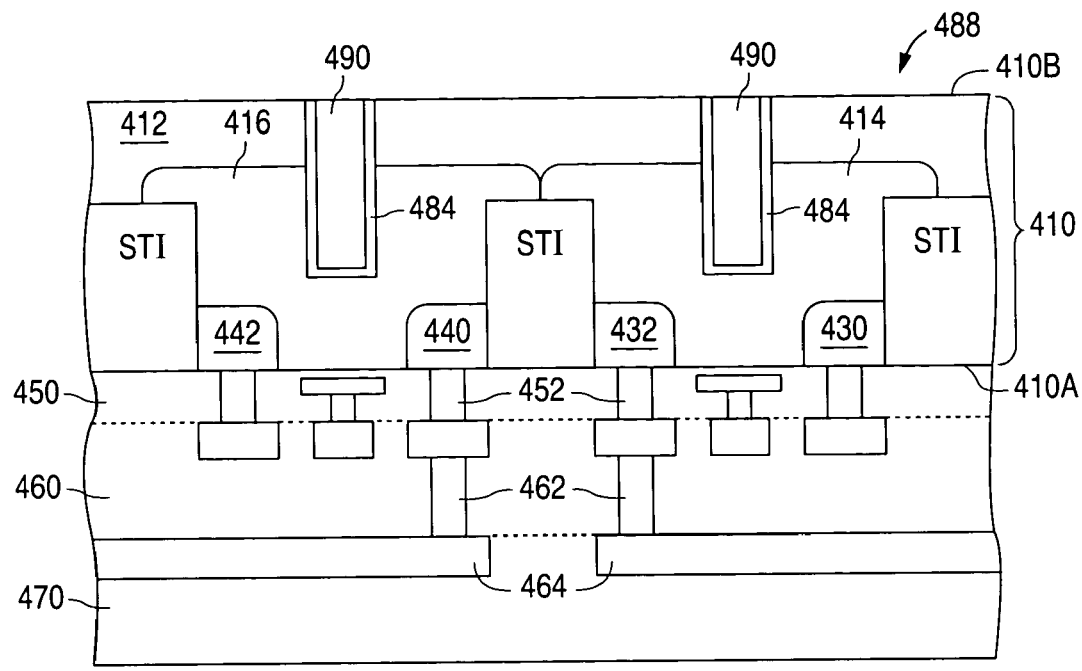

Following this, a metallic material 486 is deposited on mask 480 and in openings 482 to fill up openings 482. As shown in FIG. 4C, once openings 482 have been filled, the overlying regions of metallic material 486 and mask 480 are removed, such as by back grinding, to form a die 488 that has a number of metal regions 490 that are isolated from substrate 410 by the insulation layers 484. Die 488, in turn, is similar to die 200.

Figure 4D:
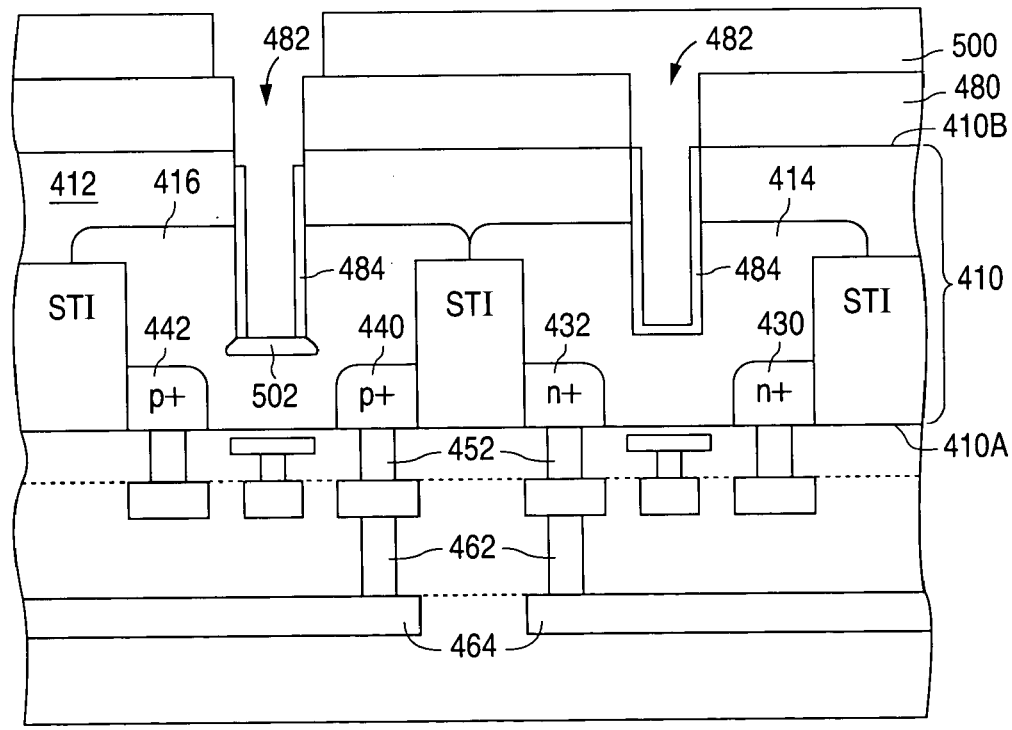

Optionally, as shown in FIG. 4D, after insulation layer 484 has been formed, a mask 500 is formed and patterned on mask 480 to expose the openings 482 that are formed over the n– wells 416. Following this, the exposed regions of substrate 410 at the bottom of openings 482 are implanted with an n– type dopant, and activated with a low temperature drive in, to form n+ contact regions 502 at the ends of the openings 482. Next, the openings 482 are anisotropically etched with, for example, a reactive ion etcher to remove the portion of insulation layer 484 that contacts the n+ contact regions 502.

Figure 4E:
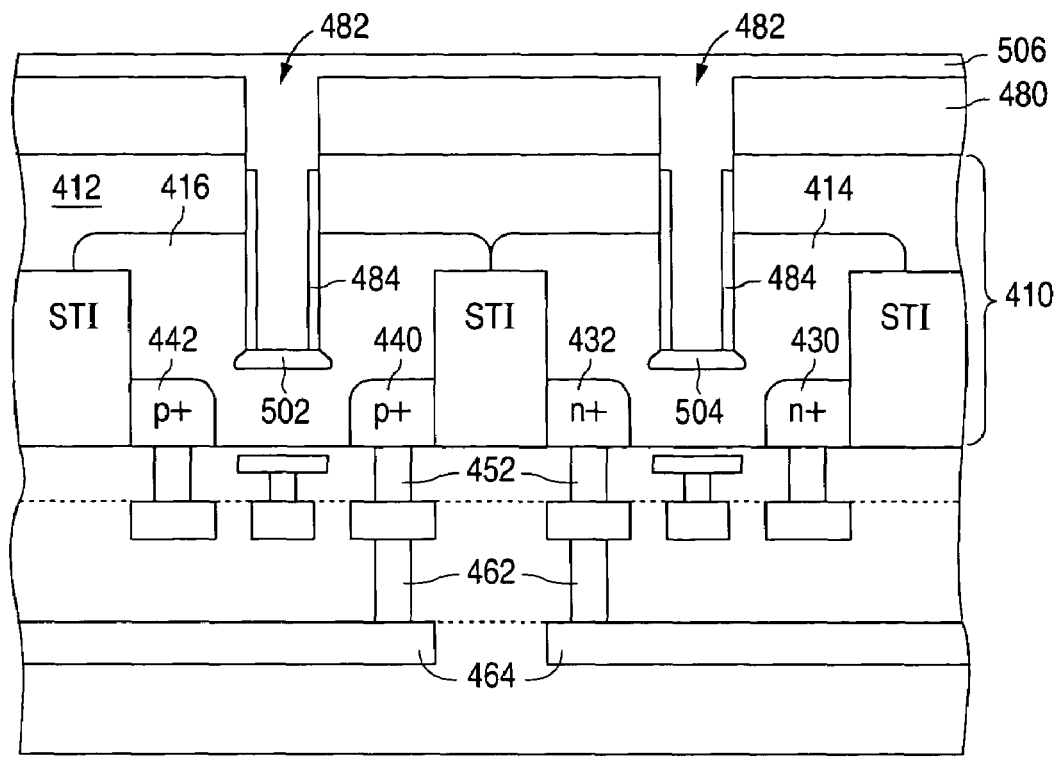

With reference to FIG. 4E, mask 500 is then removed, and the process is repeated to form p+ contact regions 504 the ends of the openings 482 that are formed over p– well 414. After this, a metallic material 506 is deposited on mask 480 and in openings 482 to fill up openings 482.

Figure 4F:
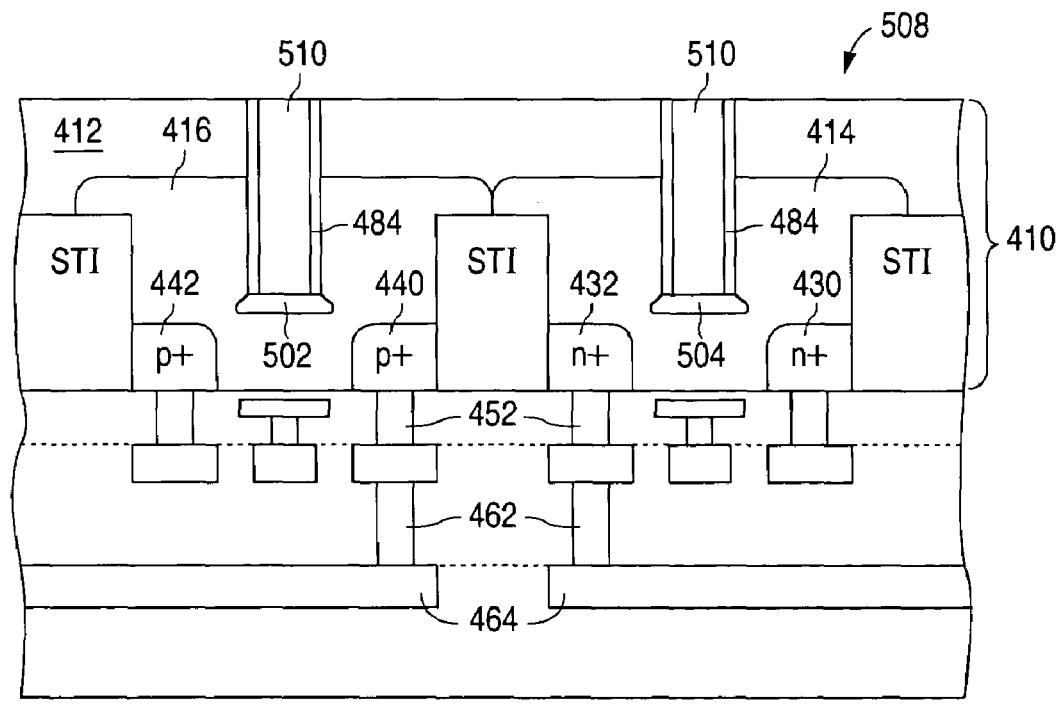

As shown in FIG. 4F, once openings 482 have been filled, the overlying regions of metallic material 506 and mask 480 are removed, such as by back grinding, to form a die 508 that has a number of metal regions 510 that are isolated from substrate 410 by the insulation layers 484. Die 508, in turn, is similar to die 300.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor die comprising:
   a semiconductor material of a first conductivity type, the semiconductor material having a top surface and a bottom surface;
   a well of a second conductivity type that contacts the semiconductor material, the well having a top surface that contacts the top surface of the semiconductor material; and
   a structure extending from the bottom surface of the semiconductor material up through the semiconductor material to contact the well without touching the top surface of the well, the structure transferring heat faster than the semiconductor material transfers heat, the structure being electrically connected to the well to place a voltage on the well, and electrically isolated from the semiconductor material so that the voltage is not placed on the semiconductor material.

2. The semiconductor die of claim 1 and further comprising:
   spaced-apart source and drain regions of the first conductivity type formed in the well;
   a channel region of the second conductivity type located between and contacting the source and drain regions;
   a layer of dielectric material that contacts the top surface of the semiconductor material over the channel region; and
   a gate lying over the channel region that contacts the layer of dielectric material.

3. The semiconductor die of claim 2 wherein the structure includes a metallic material that extends from the bottom surface to near the top surface of the semiconductor material without touching the top surface of the semiconductor material.

4. The semiconductor die of claim 3 wherein the structure includes a region of isolation material that lies between the metallic material and the semiconductor material.

5. The semiconductor die of claim 4 wherein the isolation material lies between the metallic material and the well.

6. A semiconductor die comprising:
   a semiconductor material of a first conductivity type, the semiconductor material having a top surface and a bottom surface;
   a well of a second conductivity type that contacts the semiconductor material, the well having a top surface that contacts the top surface of the semiconductor material;
   a first structure extending a first distance away from the bottom surface of the semiconductor material up through the semiconductor material to contact the well without touching the top surface of the well, the first structure transferring heat faster than the semiconductor material transfers heat; and a second structure extending a second distance away from the bottom surface of the semiconductor material up into the semiconductor material without touching the top surface of the semiconductor material, the second structure transferring heat faster than the semiconductor material transfers heat, the first and second structures being spaced apart, the first and second distances being different.

7. The semiconductor die of claim 6 and further comprising:

spaced-apart source and drain regions of the first conductivity type formed in the well;

a channel region of the second conductivity type located between and contacting the source and drain regions;

a layer of dielectric material that contacts the top surface of the semiconductor material over the channel region; and a gate lying over the channel region that contacts the layer of dielectric material.

8. The semiconductor die of claim 7 wherein the first distance is greater than the second distance.

9. The semiconductor die of claim 8 wherein the second structure is spaced apart from the well.

10. The semiconductor die of claim 9 wherein the first structure is electrically connected to the well to place a voltage on the well, and electrically isolated from the semiconductor material so that the voltage is not placed on the semiconductor material.

11. The semiconductor die of claim 10 wherein the second structure is electrically connected to the semiconductor material to place a voltage on the semiconductor material.

12. The semiconductor die of claim 7 wherein the first structure includes a metallic material and a region of isolation material that lies between the metallic material and the semiconductor material.

13. The semiconductor die of claim 12 wherein the isolation material lies between the metallic material and the well.

14. The semiconductor material of claim 13 wherein the second structure includes a metallic material isolated from the semiconductor material by an isolation material.

* * * * *